United States Patent [19]

Terkelsen

[11] Patent Number: 4,714,101

[45] Date of Patent: Dec. 22, 1987

[54] METHOD AND APPARATUS FOR EPITAXIAL SOLIDIFICATION

[75] Inventor: Bruce E. Terkelsen, Cheshire, Conn.

[73] Assignee: United Technologies Corporation, Hartford, Conn.

[21] Appl. No.: 913,834

[22] Filed: Sep. 29, 1986

Related U.S. Application Data

[63] Continuation of Ser. No. 250,521, Apr. 2, 1981, abandoned, which is a continuation of Ser. No. 121,567, Feb. 14, 1980, abandoned, which is a continuation-in-part of Ser. No. 969,130, Dec. 13, 1978, abandoned.

[51] Int. Cl.$^4$ ............................................. B22D 27/04
[52] U.S. Cl. ................................. 164/122.2; 164/361
[58] Field of Search ................. 164/122.1, 122.2, 127, 164/361

[56] References Cited

U.S. PATENT DOCUMENTS

| | | | |
|---|---|---|---|
| 3,572,419 | 3/1971 | Barrow et al. | 164/127 X |
| 3,633,648 | 1/1972 | Barrow et al. | 164/127 |
| 3,759,310 | 9/1973 | Barrow et al. | 164/122.2 X |
| 3,915,761 | 10/1975 | Tschinkel et al. | 164/127 X |

Primary Examiner—Kuang Y. Lin
Attorney, Agent, or Firm—C. G. Nessler

[57] ABSTRACT

Disclosed are a mold, apparatus and method for obtaining articles of controlled crystallographic orientation using solidification from seeds. The starter section of a directional solidification mold is adapted to both contain a seed and receive molten metal which is flowed over and about a seed to heat and partially melt it. A selector section of the mold has reduced cross section compared to the starter section so that only epitaxially solidified metal will be formed in the article section. A barrier layer resistive to molten metal is applied to portions of the seed to facilitate its removal and reuse.

13 Claims, 7 Drawing Figures

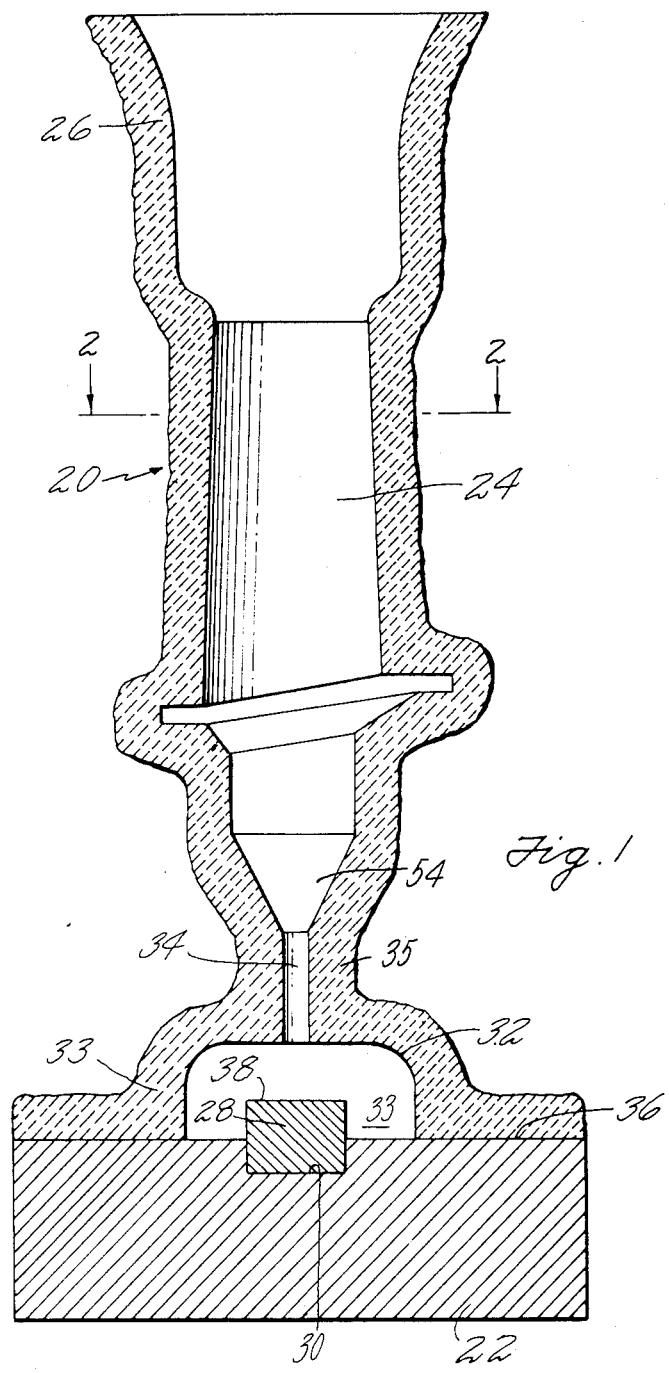

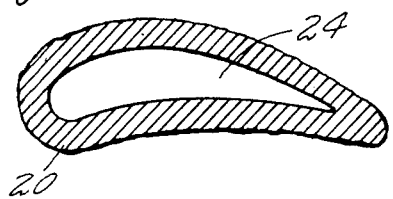
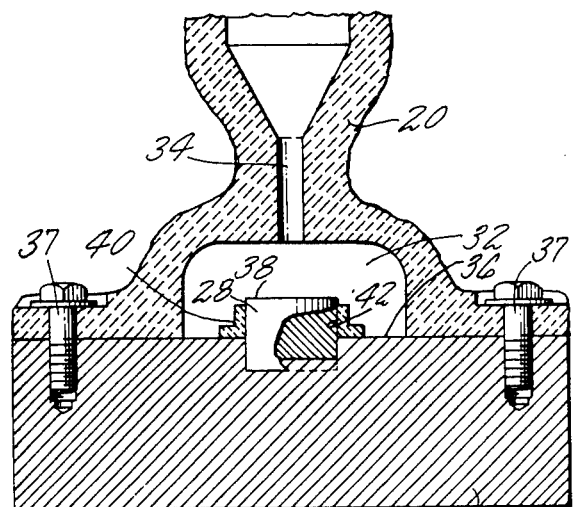
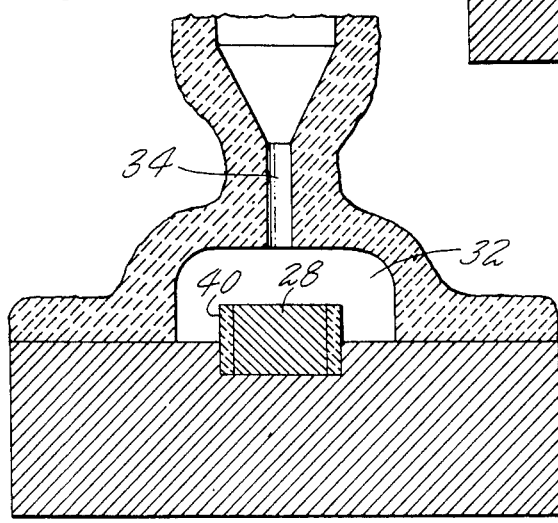
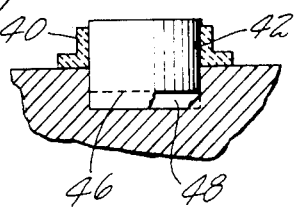
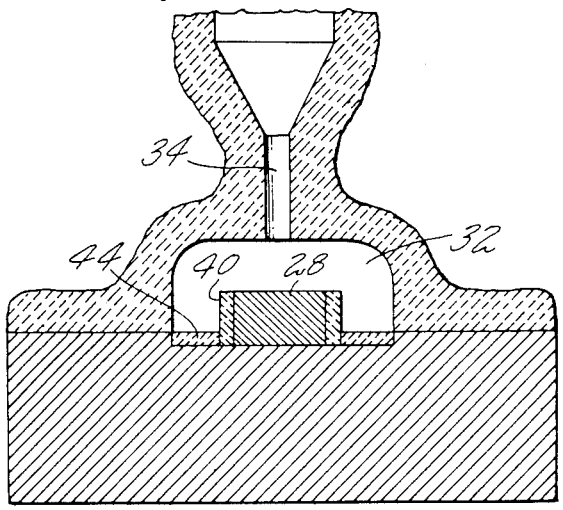
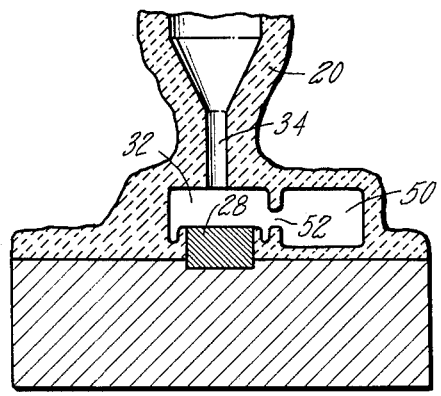

METHOD AND APPARATUS FOR EPITAXIAL SOLIDIFICATION

This is a continuation of application Ser. No. 250,521 filed Apr. 2, 1981, which was a continuation of application Ser. No. 121,567 filed Feb. 14, 1980, which was a continuation-in-part application of Ser. No. 969,130, filed Dec. 13, 1978, all of which applications are now abandoned.

BACKGROUND OF THE INVENTION

1. Field of the Invention

This invention relates to methods and apparatuses for directionally solidifying molten metals, most particularly to the production of single crystals with controlled crystallographic orientation.

2. Description of the Prior Art

It is well known that great improvements in the performance of metal structures can be achieved by unidirectional casting techniques which produce articles with columnar grain or single crystals. See, for example, the teachings of Ver Snyder, U.S. Pat. No. 3,260,505 and Piearcey, U.S. Pat. No. 3,494,709. The principal objective of the prior art apparatus, methods, and articles has been to provide structures which have enhanced properties along the principal axis of the article, that is, the principal axis of the article is typically the solidification growth axis or the axis along which the solidification front is caused to move.

When metals are directionally solidified, they often by nature solidify or grow faster in one crystallographic orientation than others. For example, in nickel base superalloys the $<001>$ orientation is found to predominate. As a result, single crystal castings made by means disclosed in U.S. Pat. No. 3,494,709, mentioned above, will have the $<001>$ orientation lying along the growth axis. Therefore, to produce another crystallographic orientation along the principal axis of solidification specialized techniques must be used. Also, the orientation of crystals with respect to the plane perpendicular to the axis of solidification is random in most directionally solidified articles unless steps are taken to achieve control. The crystallographic orientation measured along the principal axis of a casting is called the primary orientation, while the polar orientation in the plane perpendicular to the principal axis is called the secondary orientation.

The properties of a material such as a columnar grain or single crystal material are influenced by its crystallographic orientation. For example, the elastic moduli will be importantly varied in many alloys and the performance of parts under stress and strain thereby affected. Consequently in more sophisticated applications of advanced materials, it is of increasing importance to control both the primary and secondary orientations. The crystallographic orientations of materials are determinable by conventional nondestructive laboratory techniques. Radiographic diffraction, e.g. by the Laue method, is most useful. Furthermore, changes in crystallographic structure can be readily ascertained by conventional grain etching. If the orientation at a location in a part is determined, the orientation will be the same in another region in the absence of an intervening grain boundary, and absent subtle crystal variations beyond the scope of this discussion.

A useful technique for controlling crystallographic structure in cast articles is the use of a previously made metal seed which has the desired structure. If the article casting can be made to grow epitaxially from the seed, the seed structure will be reproduced.

Of course, growing objects from seeds is well known. For instance the Bridgman method for epitaxial single crystal formation disclosed in U.S. Pat. No. 1,793,672 and other publications dates from the 1920's. Delano in U.S. Pat. No. 2,791,813 describes structures with controlled crystallographic orientations in which seed crystals are used to attain the desired result. Barrow et al in U.S. Pat. No. 3,759,310 describes an apparatus and electric arc method for making single crystal articles with a consumable electrode in which a seed crystal at the bottom of the mold is used. More recently, Petrov et al in U.S. Pat. No. 3,857,436 describes an improved method and apparatus for manufacturing single crystal articles. Disclosed therein are means and methods for initiating crystallization at a conical-shaped bottom chamber where abrupt super-cooling conditions are created. Petrov U.S. Patent describes further refinements. Also, Copley U.S. Pat. No. 3,598,169, discloses the casting of relatively flat objects using seed wedges and accomplishing radially outward solidification.

With the exception of Barrow, all the aforementioned techniques anticipate heating the mold prior to the introduction of the molten metal. The practice in the prior art is that the seed is in the mold during the heating. Therefore, it is also heated with the mold to a relatively high temperature although in some situations its location would indicate lesser heating. As the superheated molten metal is introduced into the mold and allowed to stabilize, it contacts the heated seed and causes it to partially melt. Of course it is necessary to melt at least part, but only a part, of the seed, and this necessitates a control over the initial and transient conditions of the seed, mold, molten metal, and other influential factors.

Much of the prior art reflects laboratory technique and is not oriented toward mass production. Now, there is a trend towards greater commercial utilization of articles having controlled crystallographic structure, such as columnar grain and single crystal gas turbine airfoils. This has impelled the development of automated casting techniques to produce articles in quantity on an economic basis. According to one of these techniques, described in King et al, U.S. Pat. No. 3,895,672, a heated mold is clamped onto a cool chill plate just immediately prior to the introduction of molten metal into the mold. If the seed crystal is used, it is attached to the chill plate and it is, of course, correspondingly cool. The short duration between the mating of the hot mold and the cool chill plate provide little time for the temperature of the seed to increase. The same difficulty can obtain in some of the prior art apparatus and methods. If the seed is too cold, insufficient melting will occur and epitaxy will not result. One method of overcoming this is to increasingly superheat the molten metal but to do so is disadvantageous since superheating often leads to increased time and cost, undesired vaporization of elements, and increased degradation of the mold. To separately heat the seed or to include the seed with the mold when the mold is being heated after the methods of the older art is also disadvantageous, both from the mechanical and manufacturing complications and because the seed can become unduly oxidized or otherwise contaminated.

Another consideration during the manufacture of articles of controlled primary and secondary crystallographic orientation is that after manufacture, the orientation of the seed must be, first, accurately defined by suitable inspection techniques and, second, controlled precisely with respect to the axes of the articles being cast. Accordingly, the providing of seeds for casting can represent a significant cost. It is, therefore, desirable that seeds be recovered from the casting process after the article is formed and reused if possible. However, when the seed is severely melted during the casting operation or surrounded by a larger quantity of solidified metal of extraneous orientation, recover for reuse is difficult.

SUMMARY OF THE INVENTION

An object of the invention is to provide an improved method, apparatus, and mold for the production of castings of controlled crystallographic orientation using epitaxial growth from seeds having a known orientation. A further object of the invention is to provide for the preservation, recovery, and reuse of seeds.

According to the invention, a mold has an article cavity connected by a selector section to a starter cavity, wherein the starter cavity is adapted to contain a seed and receive surplus molten material which is caused by the mold design to flow over the seed to thereby heat and melt a part of it, and remove any undesirable contamination film which is present. The mold is best used conjunctively with a chill plate. Preferably the seed projects into the starter cavity to allow the surplus molten metal to surround it and thereby further heat it and aid subsequent solidification. A barrier layer, such as a ceramic coating, may be provided on selected portions of the seed to facilitate its removal from the solid metal casting for reuse. In one embodiment, thermal insulation is placed on the chill plate in portions adjacent the seed to slow solidification of molten metal of uncontrolled orientation within the starter cavity and ensure that epitaxially solidified metal originating from the seed will be present in the article.

In another embodiment of the invention, a mold has an article section connected to the starter section by a straight selector section. The starter section is adapted to contain the seed and to provide a volume capable of receiving a portion of the molten metal flowed about the seed to heat and melt it. The selector section is located in close proximity to the region in the starter section where the seed is receivable and functions to only allow metal epitaxially solidified from the seed to pass into the article section. In a preferred embodiment, the mold is adapted to receive molten metal through the article section, which then passes through the selector section, whereupon it is discharged so it impinges on the surface of the seed.

The invention is suitable for the production of cast articles of any alloy, in any desired controlled structure producible from a seed. Of particular useful application is the production of columnar grain or single crystal components of nickel superalloys.

The invention achieves the appropriate melting of the seed to ensure the desired epitaxial growth therefrom, overcoming the defective castings which may be produced when the seed is not adequately melted or the contamination layer not fully removed. Further, the invention allows the use of seed crystals which are not heated substantially prior to the introduction of molten metal into the mold. In a preferred embodiment, it further reduces the cost of seeds by providing for their ready recovery from solidified castings and subsequent reuse. The use of seeds is made more economic and therefore more feasible compared to growth without seeding, allowing the realization of benefits from primary and secondary orientation control. Single crystal mold design can be simplified and initial solidification rates increased, thereby increasing production yield.

The foregoing and other objects, features, and advantages of the present invention will become more apparent from the detailed description of the preferred embodiment and the accompanying drawings which follow.

BRIEF DESCRIPTION OF THE DRAWINGS

FIG. 1 shows a mold containing a seed mounted on a chill plate in cross section.

FIG. 2 shows a transverse cross section of the article cavity of the mold in FIG. 1.

FIG. 3 is a partial sectional view of a starter cavity of a mold on a chill plate.

FIG. 4 is a detail of the seed seating.

FIG. 5 is a partial sectional view of a seed with a barrier layer around its periphery.

FIG. 6 is a partial sectional view of an alternate embodiment of seed and chill plate barrier layers.

FIG. 7 is a partial sectional view of a mold starter cavity and separate reservoir.

DESCRIPTION OF THE PREFERRED EMBODIMENT

The preferred embodiment is described in terms of a mold particularly adapted to be utilized generally within the teachings of the aforementioned King et al U.S. Pat. No. 3,895,672, for the production of one piece single crystal nickel alloy castings, although its use is not limited to such.

A mold 20 made of a ceramic material suitable for forming a single crystal article is mounted on a copper chill plate 22 as shown in FIG. 1. The mold is comprised of a section which defines an article cavity 24 which, as FIG. 2 indicates, is configured to a gas turbine airfoil, to the production of which the present invention especially contributes. The mold further has a first end 26 for receiving molten metal and passing it into the article cavity and a second end 33 adapted to contact a chill plate.

A seed 28, having a predetermined crystallographic orientation, is mounted in a recess 30 in the chill plate 22. The seed is therefore in intimate contact with, and will be cooled by, the chill plate. Surrounding the seed is a starter cavity 32 defined by the second end 33, the starter section, of the mold and the chill plate 22. A selector section 35 connects the starter cavity 32 and the article cavity 24 at the base of which there is a transition section 54. The selector cavity 34 has a substantially smaller internal cross sectional area than either the starter cavity or article cavity.

In the preferred embodiment shown, the seed, starter cavity, and selector section are circular in cross section although other cross section shapes are equally functional.

The relative sizes of the respective elements is not fixed but may be put in general perspective by way of an example: When fabricating nickel superalloy articles, such as gas turbine airfoils 10 to 25 centimeters high, a seed of the superalloy with a diameter of 2–2.5 cm and a similar height would be preferable. The starter cavity would have a diameter of about 5 cm and the entrance to the selector section would be about 0.5–1.0 cm above the surface of the seed. The selector section size would be about 3-6 mm diameter by 6-12 mm long. Thus the starter cavity would have a volume of more than five times that of the seed contained therein. As is pointed out below, this volume is available for receiving molten metal for heating the seed and initiating epitaxial solidification therefrom.

The starter section end 33 is placed tightly against the chill plate at its surface 36 to prevent the escape of molten metal. Means for clamping, shown as bolts in FIG. 3, are utilized to maintain good contact between the mold and chill plate. Other mechanical fasteners and fixtures are equally suitable so long as they are located out of the molten metal path and are adapted to holding a mold which is at a high temperature. Of course, in mass production, a criterion in the selection of clamping means is the ease and speed of engagement and release.

When the mold and chill plate are firmly clamped together, the assembly is adapted to be placed within various apparatuses described in the prior art for directional solidification. Molten metal can be introduced and the requisite thermal gradient applied to the mold to cause directional solidification of the casting. The use of the apparatus is as follows. Molten metal is introduced into the mold 20 through the receiving end 26, passing thereupon through the article section 24 and selector cavity 34 which is adapted to impinge and flow the metal across the surface 38 of the seed 28. The action of the molten metal on the seed surface 38 thereby heats it and causes it to melt and through turbulence enhances the removal of any deposits or films. The molten metal having passed across the surface of the seed is deposited in the starter cavity 32 in the reservoir region 33 adjacent the seed. Thus the starter cavity is configured to provide a portion or region which is a receiving reservoir for the extra molten metal used to heat the seed. Optionally, as shown in FIG. 7, a receiving reservoir 50 may be located apart from but contiguous to the starter cavity 32, to which it is connected by a channel 52. This separate reservoir may be used independently or conjunctively with a reservoir within the starter cavity.

Thus it may be seen that, first, the seed is impinged upon by molten metal to cleanse and heat the surface, and a reservoir is provided to receive the metal. Second, as an improvement, the seed is mounted so it may be surrounded by the molten metal to impart additional heat to it. Thus a distinction may be made between the molten metal resting directly between the seed and the selector section which is absolutely required (elsewise no growth can take place) and the metal used to heat the seed which can be said to be surplus or extra (since other means may be used to heat and melt the seed).

Metal introduction to the starter cavity by a separate gate, as shown in U.S. Pat. No. 3,915,761, is an option. In such cases the starter cavity still must be configured to allow through-flow of molten metal, across the seed and to the region functioning as a reservoir.

As pointed out in the background, the preferred use of the invention is in a method wherein the mold is separately heated prior to clamping to the chill plate. This process provides the greatest rapidity of production and also requires the maximum heating of the cold seed. But the invention will also be found useful in processes wherein the mold is heated after clamping to the chill plate, since to economize on material, the seed may not project much from the chill plate and therefore may need considerable heating beyond that which it receives by radiation from the mold. In other instances, the seed may not project significantly above the chill plate surface and thus will be unheated, regardless of the manner in which the mold is heated. In still further instances the inventive mold and process may be used without a chill plate, as where other means such as radiation are used to extract heat from the seed and induce epitaxial solidification. These have been found effective when the molten metal is dumped very rapidly into the article cavity, thereby producing a certain head of molten metal above the selector section and resultant impingement velocity against the seed. For other article cavity configurations and rates of molten metal introduction, it may be necessary to vary the dimensions somewhat; as for example, changing the selector section dimensions to restrict and prolong flow, or increasing the reservoir capacity. Although somewhat evident, it may be noted that the seed need not be of the desired crystallographic orientation throughout. Obviously, the portion far away from the melted back end, e.g., that embedded in the chill plate, can be any orientation, as its function is mechanical. Also, the portion that is entirely dissolved away can be any orientation.

When the mold has been filled with metal, by withdrawal of heat through the chill and mold walls according to known practice, molten metal is caused to solidify progressively along the principal axis of the mold, that is, vertically. Metal in the starter section will solidify first, and of course a major portion of the seed is present as a solid throughout the process. Inasmuch as the selector section 34 is centered above the seed 28, metal which solidifies epitaxially on the surface of the seed will desirably first reach the selector section and pass therethrough. Since the solidifying metal passing through the selector section solidified epitaxially from the seed crystal, it will have the same orientation as the seed crystal. In like fashion, the article formed in cavity 24 will have a similar orientation, as it takes its structure from the earlier-formed metal emanating from the selector section and expanding in dimension through the transition section 54.

FIG. 3 illustrates in more detail the arrangement of the important elements of the invention in the starter section. To obtain a desired secondary orientation, it is necessary that the seed crystal be oriented in a predetermined manner with respect to the article cavity 24. This is achievable by orienting both the seed and mold in fixed relationship to the chill plate 22. As shown in FIG. 3, the mold is oriented to the chill plate by means of bolts 37 which also have the function of clamping the mold to the chill plate to prevent leakage. Of course, other orienting means can be utilized, particularly in mass production, such as polarizing of the chill plate and mold by shape at their contact points or using electro-optical sensors with suitable indices. Shown in the detail of FIG. 4 are means for orienting the seed with respect to the chill plate. Vertical or primary axis orientation is carried out by the obvious means of resting the seed on the surface of the chill plate. The secondary orientation, or the polar orientation about the primary axis, is controlled by means of a mating slot and key. As shown, the seed crystal has a simple slot 46 across its diameter while the chill plate is provided with an integral key way 48. Other mechanical detents and locators and other polarizing methods will also be suitable.

Further shown in FIGS. 3 and 4 is a ceramic shield 40 surrounding the circumferences of the seed 28. This is a barrier layer to prevent molten metal which has passed over the surface 38 of the seed and come to rest in the starter cavity 32 from adhering to the circumference 42 of the seed. The shield 40 will tend to inhibit melting at the seed circumference 42 and will prevent adherence of the molten metal in the cavity to the seed circumference. Accordingly, after the metal in the cavity 32 has solidified and the entire casting is removed from the mold, the casting can be cut across the plane of surface 38 and the seed will thereby be readily detachable from the starter section casting, and with minor preparation can be reused.

FIG. 5 shows an alternate embodiment of the ceramic shield 40 wherein the shield is recessed into the chill plate with the seed. The shield can be constructed from a ceramic material or any other substance which is resistant to the action of the molten metal during the short time it is exposed to it prior to solidification. It is only required that the shield be formed of a material which has the requisite thermal and corrosion resistance and is in addition of sufficient mechanical strength to not become loose under the action of the molten metal. Of course to achieve the object of the invention, the barrier layer around the seed circumference need not be a separate mechanical element but can be a coating on the seed as well. FIG. 6 shows a still further embodiment of the invention in which the seed is mounted flush with a depressed region of the surface of the chill plate together with shield 40. Shown in addition is a ceramic annular disc 44 which is resting on the chill plate surface 36 adjacent the seed. The disc 44 has the function of reducing the cooling through the chill plate, and therefore the rate of solidification of the molten metal adjacent the seed, compared to what it would be if the disc were not present. Naturally, the metal solidifying from the chill plate surface 36 will not have the desired crystallographic orientation of the seed. In particular starter cavity configurations, the presence of the disc 44 gives more assurance that metal having an undesired crystallographic orientation will not reach the selector section 34 before that metal epitaxially solidifying from the seed surface 38. In FIG. 6, the disc 44 is shown as a separate element covering the entire exposed chill plate in the cavity 32. However, the diametrical extent of coverage can be varied, for example, by decreasing the diameter of the disc 44 so that some of the chill plate surface at the periphery of cavity is exposed. Variation of the coverage of the chill plate would controllably vary heat extraction from the metal in cavity 32 to effect the desired solidification of the article. In addition, the disc 44 may be made integral with the shield 40 as is shown in FIG. 3. As another alternate, the disc 44 can be made integral with the mold 20, in which case the inner diameter of the disc portion would be varied to control heat extraction. FIG. 7 shows an embodiment wherein the shield for the seed and chill plate is integral with the mold. The disc 44 can also be configured as a coating on the chill plate, and the functioning of the disc can be varied by the thickness and thermal characteristics of the material of construction.

The use of the apparatus and method described herein can be adapted to the production of single parts or multiple parts. Of course, multiple pieces can be made by arranging a multiplicity of molds of the type shown in FIG. 1 as an assembly, as is the common practice in the mass production of directionally solidified investment castings. Alternately, more than one part may be made from a single seed crystal by spreading the mold immediately above the selector section, somewhat in the manner of Petrov, U.S. Pat. No. 3,857,436.

While the foregoing invention has been described in the preferred embodiment in terms of a single crystal casting, it is within the contemplation of the invention that columnar grain castings and other epitaxially derived casting structures will be produced. The invention is usable with any castable alloy for which a suitable mold can be fabricated. It will further be understood by those skilled in the art that various changes and omissions in the form and detail thereof may be made therein without departing from the spirit and scope of the invention.

Having thus described a typical embodiment of my invention, that which I claim as new and desire to secure by Letters Patent of the United States is:

1. For epitaxially casting metal, apparatus comprised of a chill plate, a mold in contact with the chill plate and a seed positioned on the chill plate; the mold having in a substantially vertical array an article cavity and a starter cavity, the starter cavity connected to the article cavity by a selector cavity of substantially smaller dimension than that of the starter cavity; the mold further having means for introducing molten metal into its cavities; characterized in that a portion of the seed is positioned within the mold starter cavity, the portion having a first surface aligned with the entrance to the selector cavity to enable epitaxial solidification from the first surface into the selectory cavity; and the starter cavity having substantially greater volume than the volume of the portion of the seed contained therein, to provide within the starter cavity a reservoir for metal which may be flowed across the seed; the seed projected into the starter cavity to enable molten metal to surround the seed at a second surface in addition to the first surface to provide additional heating to the seed; the seed having a barrier layer at the second surface, to prevent molten metal from adhering to the seed and to facilitate its removal from the solidified casting.

2. The apparatus of claim 1 further comprising means for thermally insulating a portion of the chill plate adjacent the seed to lessen heat loss from surplus metal placed in the starter cavity.

3. The apparatus of claim 2 further comprising a mold having a starter cavity with an open end, the open end in contact with and closed by the chill plate; means for holding the seed in predetermined orientation to the chill plate; and means for holding the mold fixedly to the chill plate, to contain molten metal and control the orientation of the mold with respect to the chill plate.

4. The apparatus of claim 1 wherein the seed is cylindrical and the barrier layer is on the circumferential surface thereof.

5. For expitaxially casting metal, apparatus comprised of a chill plate; a ceramic mold in contact with the chill plate, the mold having in a substantial vertical serial array an article cavity, a selector cavity, and a starter cavity; a metal seed positioned on the chill plate so an upper surface thereof is aligned with the selector cavity; and, means for introducing molten metal into the mold; characterized by the starter cavity having at least two openings, one being an uppermost opening communicating with the selector cavity and having substantially smaller lateral dimension than the lateral dimension of the starter cavity, the second opening being a lowermost opening closed by the chill plate; the metal seed projecting vertically into the space of the starter cavity; the side walls of the starter cavity being laterally spaced apart from the sides of the seed where it projects into the starter cavity to create a lateral space cavity, to thereby provide a reservoir surrounding the seed for metal which may be flowed across the seed.

6. The apparatus of claim 5 characterized by means for introducing molten metal which is a pouring cone connected to the article cavity, and by a cylindrical shaped selector section oriented to impinge molten metal on the upper surface of the seed, to facilitate melting and removal of surface films from the seed.

7. The apparatus of claim 5 characterized by the mold having an additional reservoir connected to the starter cavity by a channel, to further receive molten metal flowed across the seed.

8. The apparatus of claim 5 characterized in that the seed has a barrier layer on its lateral sides.

9. The apparatus of claim 8 characterized by the chill plate adjacent to the seed having thermal insulation thereon, to lessen heat loss from the metal flowing into the reservoir space.

10. The apparatus of claim 5 characterized by means for holding both the seed and mold in predetermined orientation to the chill plate.

11. The method of casting metals into an article having controlled crystallographic orientation using a seed and a chill plate which comprises:
   (a) placing a cold seed on the lateral surface of a cold chill plate so the seed projects above the surface of the chill plate with a controlled orientation thereto;
   (b) heating a mold and then placing it on the chill plate with a controlled orientation thereto, so the seed is contained within a cavity of the mold and so there is created a lateral space cavity surrounding the seed;
   (c) filling the mold with molten metal in a manner which causes a portion of the molten metal to flow across the part of the seed projecting from the chill plate, to heat and melt a portion of the seed;
   (d) flowing the metal which sweeps across the seed into said lateral space cavity; and
   (e) epitaxially solidifying the molten metal from the seed.

12. The method of claim 11 characterized by preventing liquid metal from adhering to the lateral sides of the seed by coating the seed with the thin barrier layer.

13. The method of claim 11 characterized by insulating the chill plate adjacent the lateral space surrounding the seed.

* * * * *